United States Patent
Hwang et al.

(10) Patent No.: US 7,880,715 B2
(45) Date of Patent: Feb. 1, 2011

(54) INVERTER AND DISPLAY DEVICE HAVING THE SAME

(75) Inventors: Eui-dong Hwang, Incheon (KR); Young-eun Lee, Chungcheongnam-do (KR); Young-sup Kwon, Seoul (KR); Dal-jung Kwon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1017 days.

(21) Appl. No.: 11/708,937

(22) Filed: Feb. 20, 2007

(65) Prior Publication Data
US 2007/0234166 A1 Oct. 4, 2007

(30) Foreign Application Priority Data
Feb. 21, 2006 (KR) .............. 10-2006-0016897

(51) Int. Cl.
G09G 3/36 (2006.01)
G02F 1/1335 (2006.01)

(52) U.S. Cl. ............... 345/102; 349/61; 315/254

(58) Field of Classification Search .......... 349/58, 349/61; 345/102; 315/254
See application file for complete search history.

(56) References Cited

U.S. PATENT DOCUMENTS

2005/0007333 A1* 1/2005 Han et al. ............ 345/102
2006/0133108 A1* 6/2006 Choi et al. ............ 362/613

* cited by examiner

Primary Examiner—David Nelms
Assistant Examiner—Nathanael R Briggs
(74) Attorney, Agent, or Firm—Innovation Counsel LLP

(57) ABSTRACT

A display device and an inverter therefor are disclosed. The inverter has a main circuit board having a plurality of first circuit patterns and a plurality of second circuit patterns formed on a first side thereof, and a sub circuit board having first connecting patterns corresponding to the plurality of first circuit patterns formed on one side of the sub circuit board and second connecting patterns corresponding to the plurality of second circuit patterns formed on a second side thereof. The plurality of first circuit patterns are coupled with each other through the first connecting patterns, and the plurality of second circuit patterns are coupled with each other through the second connecting patterns. Thus, the present invention provides an inverter and a display device having the same, which are capable of being manufactured at a low production cost.

23 Claims, 6 Drawing Sheets

INVERTER AND DISPLAY DEVICE HAVING THE SAME

CROSS-REFERENCE TO RELATED APPLICATIONS

This application claims priority to Korean Patent Application No. 2006-0016897, filed on Feb. 21, 2006, the disclosure of which is incorporated herein by reference in its entirety.

BACKGROUND OF THE INVENTION

1. Field of the Invention

The present invention relates to an inverter and a display device having the same, and more particularly, to an inverter and a display device having the same, which are capable of being manufactured at a low production cost.

2. Description of the Related Art

Flat display devices such as liquid crystal display (LCD) devices, plasma display panel (PDP) devices, and organic light emitting diode (OLED) devices have been developed to replace conventional cathode ray tube (CRT) devices. An LCD comprises an LCD panel, a light source located behind the LCD panel, and an inverter that supplies power to the light source.

Inverters may be classified into a serial driving type and a parallel driving type. The parallel driving type uses one inverter to drive a plurality of light sources, thereby reducing production costs and the number of parts as well as avoiding circuit complexity.

The inverter comprises a connector receiving power from the outside, various electronic parts converting the received power adequately, and a circuit board on which the connector and the various electronic parts are mounted. The circuit board is provided with a plurality of circuit patterns interconnecting the electronic parts. Since the circuit patterns are applied with high voltages, the circuit patterns have to be isolated from each other at certain intervals to minimize electrical interference between the circuit patterns. Also, the circuit patterns must be designed in such a manner that circuits do not intersect or short each other. Under these conditions, formation of the circuit patterns leads to increase of an area of the circuit board which may be relatively expensive, and hence increase of production costs.

To reduce the production costs, a method of forming the circuit patterns on both sides of the circuit board has been used. However, this method also can not give a remarkable improvement in respect to the production costs over the conventional method of forming the circuit patterns on a single side of the circuit board.

SUMMARY OF THE INVENTION

Accordingly, it is an aspect of the present invention to provide an inverter and a display device having the same, which are capable of being manufactured at a low production cost.

The foregoing and/or other aspects of the present invention can be achieved by providing a display device comprising: an LCD panel; a plurality of light sources that emit light to a rear side of the LCD panel; and an inverter that supplies power to the light sources, the inverter comprising a main circuit board having a plurality of first circuit patterns and a plurality of second circuit patterns formed on a first side of the main circuit board, and a sub circuit board having first connecting patterns corresponding to the plurality of first circuit patterns formed on one side of the sub circuit board and second connecting patterns corresponding to the plurality of second circuit patterns formed on a second side of the sub circuit board, and the plurality of first circuit patterns being coupled with each other through the first connecting patterns, and the plurality of second circuit patterns being coupled with each other through the second connecting patterns, when the sub circuit board is coupled with the main circuit board.

According to an embodiment of the present invention, the area of the sub circuit board is smaller than the area of the main circuit board.

According to an embodiment of the present invention, the length of a long side of the sub circuit board is substantially equal to the length of a long side of the main circuit board, and the length of a short side of the sub circuit board corresponds to 5% to 20% of the length of a short side of the main circuit board.

According to an embodiment of the present invention, the inverter comprises a power converter that converts power supplied from the outside into a first power and a second power to be transmitted to the light sources, the main circuit board is provided with a first connecting terminal and a second connecting terminal that receive the first power and the second power, respectively, from the power converter, and the first connecting terminal is connected to the first connecting patterns, and the second connecting terminal is connected to the second connecting patterns.

According to an embodiment of the present invention, the first circuit patterns comprise first input circuit patterns and first output circuit patterns, and the second circuit patterns comprise second input circuit patterns and second output circuit patterns, and the first connecting patterns are connected to the first input circuit patterns to supply the received first power to the light sources through the first output circuit patterns, and the second connecting patterns are connected to the second input circuit patterns to supply the received second power to the light sources through the second output circuit patterns.

According to an embodiment of the present invention, the first circuit patterns and the second circuit patterns are alternately arranged.

According to an embodiment of the present invention, the power converter is mounted on the main circuit board.

According to an embodiment of the present invention, the power converter is mounted on a circuit board other than the main circuit board.

According to an embodiment of the present invention, the display device further comprises a receptacle that accommodates the light sources, wherein the inverter is disposed so that a side of the main circuit board, which is not coupled with the sub circuit board, faces a rear side of the receptacle.

According to an embodiment of the present invention, the long side of the sub circuit board is coupled to contact one side of the main circuit board.

According to an embodiment of the present invention, a combining groove is provided at each short side of the main circuit board, and combining protrusions for coupling to the combining grooves are provided at opposite end parts of the long side of the sub circuit board.

According to an embodiment of the present invention, the first circuit patterns, the first connecting patterns, the second circuit patterns and the second connecting patterns are provided as a form of a surface mounted device (SMD).

According to an embodiment of the present invention, the first connecting terminal, the first connecting patterns, the second connecting terminal and the second connecting patterns are provided as a form of an SMD.

The foregoing and/or other aspects of the present invention can be achieved by providing an inverter comprising: a main circuit board having a plurality of first circuit patterns and a plurality of second circuit patterns formed on first side of the main circuit board; and a sub circuit board having first connecting patterns corresponding to the plurality of first circuit patterns formed on a first side of the sub circuit board and second connecting patterns corresponding to the plurality of second circuit patterns formed on a second side of the sub circuit board, the plurality of first circuit patterns being coupled with each other through the first connecting patterns, and the plurality of second circuit patterns being coupled with each other through the second connecting patterns, when the sub circuit board is coupled with the main circuit board.

According to an embodiment of the present invention, the area of the sub circuit board is smaller than the area of the main circuit board.

According to an embodiment of the present invention, the length of a long side of the sub circuit board is substantially equal to the length of a long side of the main circuit board, and the length of a short side of the sub circuit board corresponds to 5% to 20% of the length of a short side of the main circuit board.

According to an embodiment of the present invention, the inverter further comprises a power converter that converts power supplied from the outside into a first power and a second power to be transmitted to the light sources, wherein the main circuit board is provided with a first connecting terminal and a second connecting terminal that receive the first power and the second power, respectively, from the power converter, and the first connecting terminal is connected to the first connecting patterns, and the second connecting terminal is connected to the second connecting patterns.

According to an embodiment of the present invention, the first circuit patterns comprise first input circuit patterns and first output circuit patterns, and the second circuit patterns comprise second input circuit patterns and second output circuit patterns, and the first connecting patterns are connected to the first input circuit patterns to supply the received first power to the light sources through the first output circuit patterns, and the second connecting patterns are connected to the second input circuit patterns to supply the received second power to the light sources through the second output circuit patterns.

According to an embodiment of the present invention, the first circuit patterns and the second circuit patterns are alternately arranged.

According to an embodiment of the present invention, the long side of the sub circuit board is coupled to contact one side of the main circuit board.

According to an embodiment of the present invention, a combining groove is provided at each short side of the main circuit board, and combining protrusions for coupling to the combining grooves are provided at opposite end parts of the long side of the sub circuit board.

According to an embodiment of the present invention, the first circuit patterns, the first connecting patterns, the second circuit patterns and the second connecting patterns are provided as a form of an SMD.

According to an embodiment of the present invention, the first connecting terminal, the first connecting patterns, the second connecting terminal and the second connecting patterns are provided as a form of an SMD.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENT

Reference will now be made in detail to exemplary embodiments of the present invention, examples of which are illustrated in the accompanying drawings.

Figure 1:
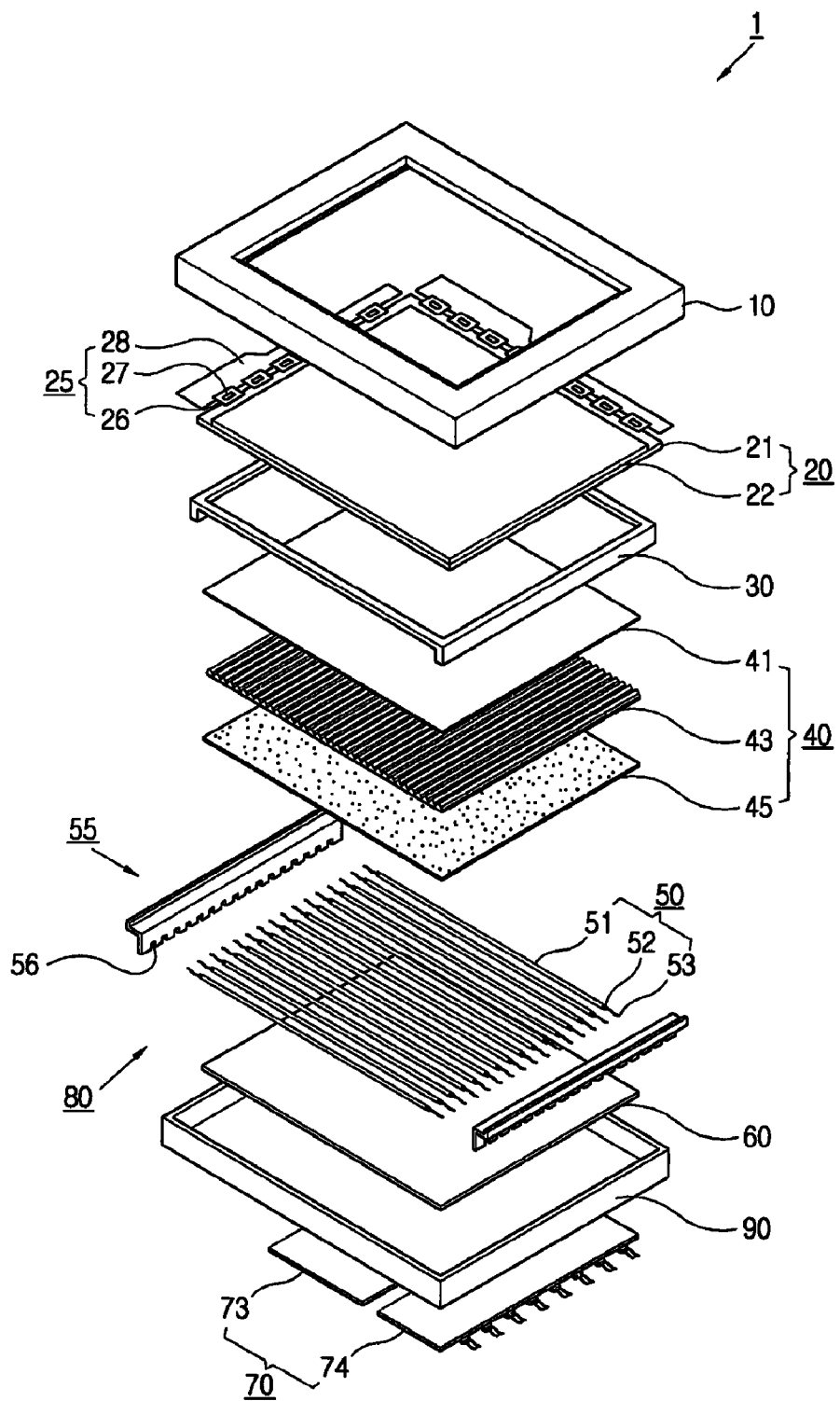
FIG. 1 is an exploded perspective view of a liquid crystal display device according to an embodiment of the present invention.
Figure 2:
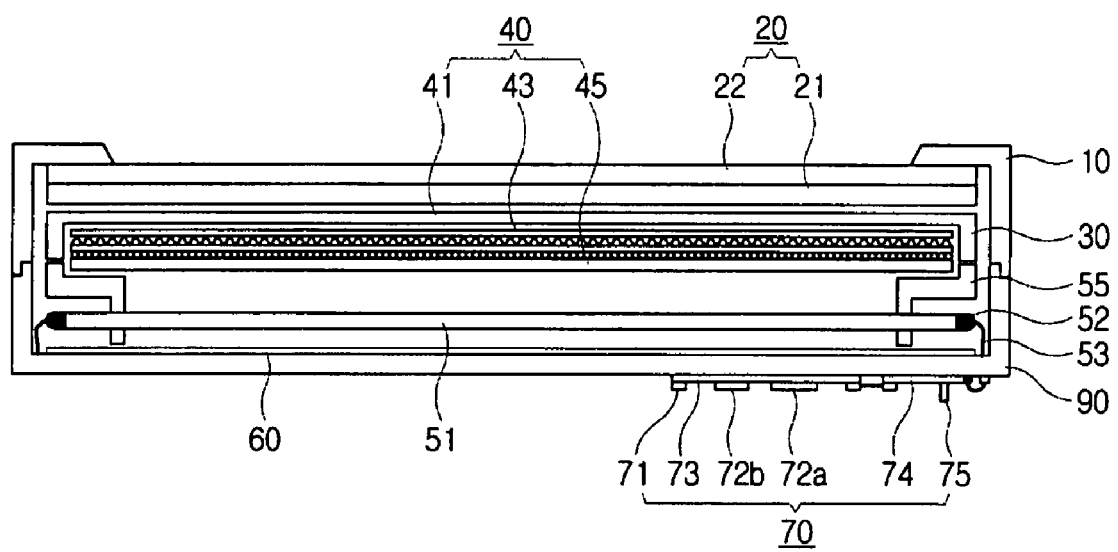
FIG. 2 is a sectional view of the liquid crystal display device according to an embodiment of the present invention.

FIG. 1 is an exploded perspective view of a liquid crystal display (LCD) device 1 according to an embodiment of the present invention, and FIG. 2 is a sectional view of the LCD device 1 according to an embodiment of the present invention.

Referring to FIG. 1, the LCD device 1 comprises a LCD panel 20 that forms an image, a driver 25 that drives the LCD panel 20, a mold frame 30 that supports an edge of the LCD panel 20, a backlight unit 80 that emits light toward a rear side of the LCD panel 20, a receptacle 90 that accommodates the backlight unit 80 and supports the mold frame 30, and a holding member 10 that is coupled with the receptacle 90 and covers the entire surface of the LCD panel 20.

The LCD panel 20 comprises a thin film transistor (TFT) substrate 21, a color filter substrate 22 opposite to the TFT substrate 21, and a liquid crystal layer (not shown) interposed between the TFT substrate 21 and the color filter substrate 22. The liquid crystal layer is formed by injecting and hermetically sealing liquid crystals between the TFT substrate 21 and the color filter substrate 22. The LCD panel 20 further comprises a front polarizer (not shown) attached to a front side of the color filter substrate 22 and a rear polarizer (not shown) attached to a rear side of the TFT substrate 21. The LCD panel 20 has liquid crystal cells, each of which forms a pixel unit, arranged in the form of a matrix. With this configuration, the LCD panel 20 forms an image by controlling light transmittance of the liquid crystal cells according to an image signal transmitted from the driver 25.

The TFT substrate 21 has a plurality of gate lines and data lines, which intersect each other, and pixel electrodes and TFTs formed in the form of a matrix. A signal voltage supplied through the TFTs is applied to the liquid crystals (not shown) by the pixel electrodes, and then, the liquid crystals are aligned to determine light transmittance according to the applied signal voltage.

On the color filter substrate 22 are formed color filters comprising RGB pixels expressing a predetermined color while light passes therethrough, and a common electrode comprising a transparent conductive material such as ITO (indium tin oxide), IZO (indium zinc oxide) or the like. The color filter substrate 22 has a smaller area than the TFT substrate 21. A region where the color filter substrate 22 overlaps the TFT substrate 21 becomes a display region of the LCD panel 20 and a peripheral region where both substrates 21 and 22 do not overlap each other becomes a non-display region of the LCD panel 20.

The front polarizer and the rear polarizer are disposed in a cross-polarizing manner. The rear polarizer polarizes light incident onto the LCD panel 20 and the front polarizer serves as an analyzer.

The driver 25 is provided at one side of the TFT substrate 21 and outputs a driving signal. The driver 25 comprises a flexible printed circuit board (FPC) 26, driving chips 27 mounted on the FPC 26, and a printed circuit board (PCB) 28 connected to one side of the FPC 26. The shown driver 25 is of a chip-on-film (COF) type, but may be one of the other known types such as a taper carrier package (TCP) type, a chip-on-glass (COG) type and so on. The driver 25 may be mounted on an edge of the TFT substrate 21.

The mold frame 30 is formed along a circumference of the LCD panel 20 and has a substantially rectangular shape. The mold frame 30 isolates the LCD panel 20 from the backlight unit 80 and supports the LCD panel 20.

The backlight unit 80, which is placed in the rear side of the LCD panel 20, comprises an optical sheet assembly 40, a plurality of light sources 50, a reflecting sheet 60 and an inverter 70.

The optical sheet assembly 40 is placed in the rear side of the LCD panel 20 and comprises a diffusing sheet 45, a prism sheet 43 and a passivation sheet 41. The diffusing sheet 45 comprises a base plate and an uneven coating layer formed in the base plate. The diffusing sheet 45 diffuses light from lamps 50 and supplies the diffused light to the LCD panel 20. The diffusing sheet 45 may comprise two or three overlapped sheets. The diffusing sheet 45 may be relatively thick for strength since it is not supported by a light guiding plate, unlike an edge type. The prism sheet 43 includes a plurality of triangular prisms regularly arranged on an upper side thereof. The prism sheet 43 concentrates the light diffused by the diffusing sheet 45 in a direction perpendicular to the LCD panel 20. The prism sheet 43 typically comprises two sheets, each of which has micro prisms formed with a predetermined angle thereon. Light passing through the prism sheet 43 is mostly supplied to the LCD panel 20 to provide a uniform brightness distribution. The passivation sheet 41 located on the prism sheet 43 protects the prism sheet 43 which is apt to be scratched.

The plurality of light source 50 is arranged in parallel to each other behind the LCD panel 20. The light sources 50 may be provided with cold cathode fluorescent lamps (CCFLs), or external electrode fluorescent lamps (EEFLs). Each light source 50 comprises a main body 51 that emits light, electrodes 52 at both ends of the main body 51, and wires 53 drawn out of the electrodes. The electrodes 52 are connected, via the wires 53, to the inverter 70, which will be described later, in order to receive power from the inverter 70.

A pair of side molds 55 is placed on both sides of the receptacle 90 in a longitudinal direction of the light source 50. The side molds 55 have a stepped-up shape. An edge of the optical sheet assembly 40 is supported on sides of the stepped-up shape. In the side molds 55 are formed insertion holes 56 into which ends of the light sources 50 are inserted.

The reflecting sheet 60, which is placed between the light sources 50 and the receptacle 90, reflects the light from the light sources 50 toward the diffusing sheet 45. The reflecting sheet 60 may comprise such material as poly ethylene terephthalate (PET) or poly carbonate (PC).

The inverter 70 comprises a connector 71 supplied with power from the outside, an inverter circuit board 73, and power distribution circuit boards 74 and 75, as shown in FIGS. 1 and 2. On the inverter circuit board 73 are mounted a power converter 72a to convert the power and to supply the converted power to other components and an inverter controller 72b to control the power converter 72a. The power distribution circuit boards 74 and 75 have a plurality of circuit patterns formed to distribute the power, which is supplied from the power converter 72a, to the light sources 50.

In addition, the inverter circuit board 73 is provided with a plurality of circuit patterns to interconnect between the connector 71, the power converter 72a and the inverter controller 72b. The connector 71 receives the power from the outside, and the power converter 72a converts the power into a form of power suitable for the light sources 50 under control of the inverter controller 72b and may comprise a transformer, a switching part and so on. Also, the inverter controller 72b controls switching-on/off of the light sources 50 by controlling the power converter 72a according to light source switching-on/off signals applied from a display device controller (not shown). That is, when a light source switching-on signal is applied to the inverter controller 72b, the inverter controller 72b turns on the switching part, and accordingly, the power converter 72a converts a received direct voltage into an alternating voltage. In addition, the transformer of the power converter 72a boosts a voltage of a corresponding magnitude according to the frequency and magnitude of an alternating voltage to be applied to the light sources 50 and then transmits the boosted voltage to the power distribution circuit boards 74 and 75. For example, the power converter 72a converts the power supplied from the outside into a first power and a second power to be transmitted to both ends of each light source 50 under control of the inverter controller 72b. Also, the inverter controller 72b controls the power converter 72a so that the light sources 50 operate with a predetermined brightness according to a brightness control signal. In addition, at one side of the inverter circuit substrate 73 are formed terminals to interconnect the power converter 72a and the power distribution circuit substrates 74 and 75. The terminals are interconnected by a connecting line. In addition, at corners and edges of the inverter circuit boards 73 are formed a plurality of through holes 83 (see FIG. 5) through which screws pass, to thereby combine the inverter circuit substrate 73 to the receptacle 90.

In general, how to reduce the cost of an expensive and small-sized PCB depends on the degree of integration of circuit patterns and electronic elements on the PCB. However, since a high voltage is applied to circuit patterns of the power distribution circuit boards 74 and 75, the circuit patterns have to be isolated from each other at predetermined intervals to minimize electrical interference between the circuit patterns. Also, it must be designed in such a manner that the circuit patterns do not intersect (and thereby electrically short) each other. Under these conditions, formation of the circuit patterns leads to increase of an area of the circuit board, and hence increase of production costs of the LCD device.

To reduce the production costs, recently, the circuit patterns have been formed on both sides of the circuit board to minimize the area of the circuit board. However, this method also can not give a remarkable improvement in respect to the production costs over the conventional method of forming the circuit patterns on a single side of the circuit board.

Figure 3A:
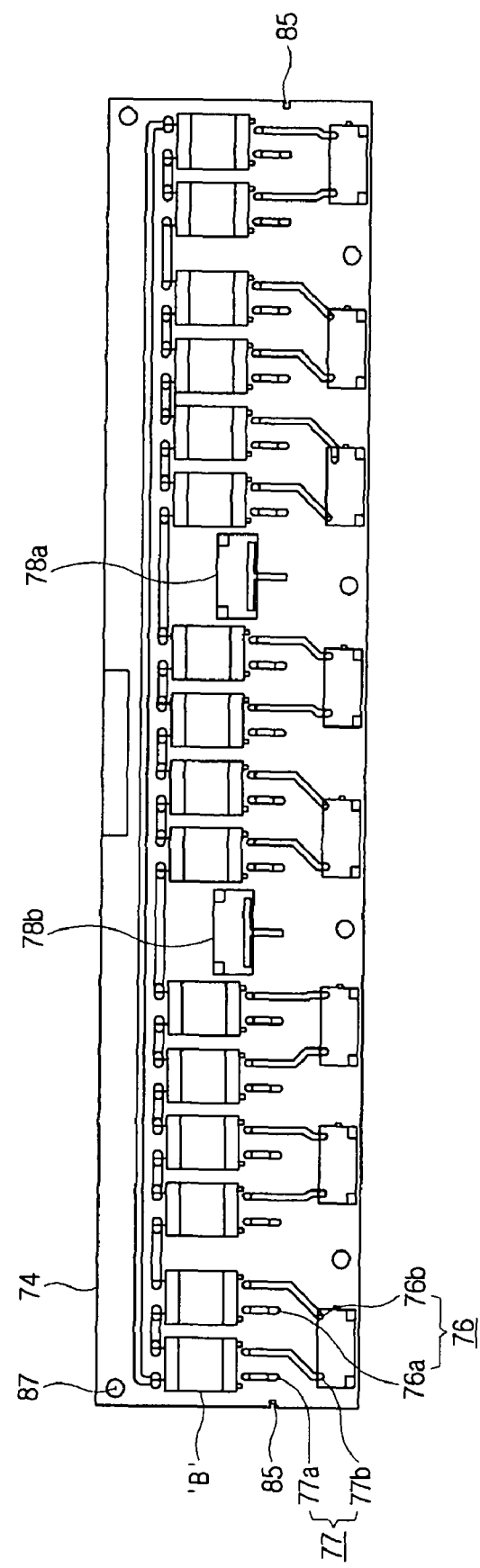
FIG. 3A is a plan view of a main circuit board according to an embodiment of the present invention.
Figure 3B:
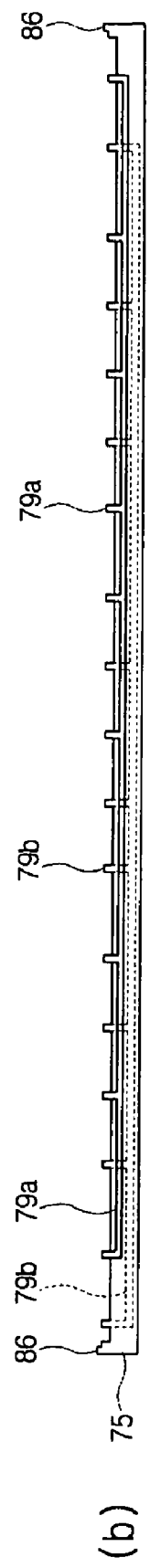
FIG. 3B is a plan view of a sub circuit board according to an embodiment of the present invention.

According to an aspect of the present invention, the power distribution circuit boards 74 and 75 are divided into a main circuit board 74 and a sub circuit board 75. On one side of the main circuit board 74 are integrated the circuit patterns in a non-intersecting manner. When the circuit patterns are formed on the one side of the main circuit board 74, portions where the circuit patterns do not intersect each other are separately formed on both sides of the sub circuit board 75. That is, the circuit patterns of the sub circuit board 75 complete the circuit patterns of the main circuit board 74 by providing the missing portions of the circuit patterns of the main circuit board 74 that would have intersected (and thus electrically shorted) if they have been formed upon the main circuit board 74 and that do not intersect because they are formed on the sub circuit board 75. Thus, use of the sub circuit board 75 effectively provides overlapping, electrically isolated traces without the need to form traces on both sides of the main circuit board 74. More specifically, as shown in FIGS. 3a and 3b, on the one side of the main circuit board 74 are provided a plurality of first circuit patterns 76 and a plurality of second circuit patterns 77. On one side of the sub circuit board 75 are provided first connecting patterns 79a corresponding to the first circuit patterns 76, and on the other side of the sub circuit board 75 are provided second connecting patterns 79b corresponding to the second circuit patterns 77. That is, the circuit patterns 76 and 77 are formed only on the one side of the main circuit board 74, and different forms of circuit patterns 79a and 79b are formed on both sides of the sub circuit board 75. First connecting patterns 79a of sub circuit board 75 provide bridges that avoid undesirable intersections in first circuit patterns 76 of main circuit board 74. Similarly, second connecting patterns 79b of sub circuit board 75 provide bridges that avoid undesirable intersections in second circuit patterns 77 of main circuit board 74. In addition, at corners and edges of the main circuit board 74 are formed a plurality of through holes 87 through which screws pass, to thereby combine the main circuit board 74 to the receptacle 90.

In addition, as shown in FIGS. 3a and 3b, the first circuit patterns 76 and the second circuit patterns 77 are alternately arranged. The first circuit patterns 76 comprise first input circuit patterns 76a and first output circuit patterns 76b, and the second circuit patterns 77 comprise second input circuit patterns 77a and second output circuit patterns 77b. The first and second input circuit patterns 76a and 77a are provided to be shorter than the first and second output circuit patterns 76b and 77b, and the first and second input circuit patterns 76a and 77a are connected to the first and second output circuit patterns 76b and 77b via balance coils B. In addition, in the main circuit board 74 are provided a first connecting terminal 78a and a second connecting terminal 78b, which are connected to the power converter 72a and receive the first power and the second power, respectively, to be transmitted to the first and second connecting patterns 79a and 79b connected to the first and second connecting terminals 78a and 78b, respectively.

Figure 4:
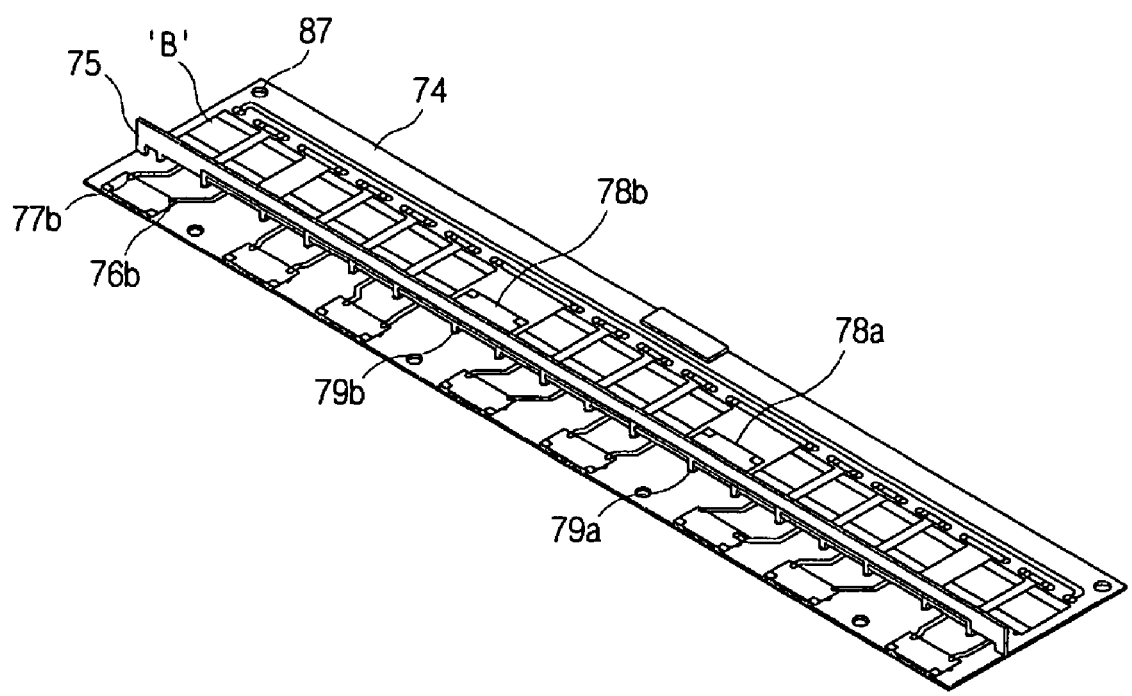
FIG. 4 is an assembled perspective view of a main circuit board and a sub circuit board according to an embodiment of the present invention.

In addition, as shown in FIG. 4, the sub circuit board 75 is coupled with the main circuit board 74. More specifically, combining grooves 85 are respectively provided at opposite short sides of the main circuit board 74, and combining protrusions 86 (see FIG. 3b) to be coupled with the combining grooves 85 are respectively provided at opposite ends of the sub circuit board 75. The combining protrusions 86 protrude along a longitudinal direction of the short side from edges of the short side and long side of the sub circuit board 75. The combining protrusions 86 extend outwardly from the sub circuit board 75 such that they are generally orthogonal to the long axis of the sub circuit board 75. The main circuit board 74 and the sub circuit board 75 are pressed to be coupled with each other in such a manner that the combining protrusions 86 of the sub circuit board 75 face the combining grooves 85 of the main circuit board 74, with the long side of the sub circuit board 75 contacting with a surface of the main circuit board 74 as shown in FIG. 4. That is, the sub circuit board 75 is perpendicularly coupled with main circuit board 74. When the sub circuit board 75 is coupled with the main circuit board 74, the first input circuit patterns 76a are coupled with the first connecting patterns 79a, and the second input circuit patterns 76b are coupled with the second connecting patterns 79b. Since the first input circuit patterns 76a, the first connecting patterns 79a, the second input circuit patterns 76b and the second connecting patterns 79b are provided as a form of SMD (surface mounted device), these patterns may be welded without difficulty. As described above, since the first connecting terminal 78a, the first connecting patterns 79a, the second connecting terminal 78b and the second connecting patterns 79b are also provided as a form of SMD, these terminals and patterns may be welded without difficulty.

A connection structure of the above-described circuit patterns and a flow of power in the connection structure will be now described.

When the sub circuit board 75 is coupled with the main circuit board 74, the first input circuit patterns 76a are coupled with each other by the first connecting patterns 79a, and the second input circuit patterns 77a are coupled with each other by the second connecting patterns 79b. The first connecting terminal 78a provided in the main circuit board 74 is connected to one end of the first connecting patterns 79a of the sub circuit board 75, and the second connecting terminal 78b is connected to one end of the second connecting patterns 79b.

With this connection structure, the first power supplied from the power converter 72a is transmitted to the first connecting patterns 79a through the first connecting terminal 78a, and the second power supplied from the power converter 72a is transmitted to the second connecting patterns 79b through the second connecting terminal 78b. The first and second powers are distributed to the first and second input circuit patterns 76a and 77a through the connecting patterns 79a and 79b, respectively. Then, the first and second powers distributed to the first and second input circuit patterns 76a and 77a are transmitted to the first and second output circuit patterns 76b and 77b through the balance coils B. The first and second powers transmitted to the first and second output circuit patterns 76b and 77b are supplied to the light sources 50 through the connector 71 connected to the light sources 50. In this case, the balance coils B reduce deviations between the first powers to be transmitted to the first output circuit patterns 76a and between the second powers to be transmitted to the second output circuit patterns 76b.

In other embodiment, the combining grooves 85 may be provided at the sub circuit board 75 and the combining protrusions 86 may be provided at the main circuit board 74.

The first and second powers can be defined by any combination of different voltages, amperages, and/or polarities.

In this embodiment, the area of the sub circuit board 75 having the circuit patterns formed on its two sides is smaller than the area of the main circuit board 74. More specifically, the length of the long side of the sub circuit board 74 is substantially equal to that of the main circuit board 75, and the length of the short side of the sub circuit board 74 may correspond to 5% to 20% of the length of the short side of the main circuit board 75. The main circuit board 74 having a relatively large area has the circuit patterns formed only on its one side. Accordingly, it may be designed in such a manner that the circuit patterns do not intersect each other while maintaining an effective isolation distance between the circuit patterns, and also, the area of the expensive sub circuit board 75 having the circuit patterns formed on its two sides is reduced, thereby saving the production costs. In addition, since the main circuit board 74 having the relatively large area has the circuit patterns formed only on its one side, the production costs can be also reduced.

Although it has been illustrated in this embodiment that the connector 71, the power converter 72*a* and the inverter controller 72*b* are mounted on a circuit board other than the main circuit board 74, these components may be mounted on the main circuit board 74.

Figure 5:
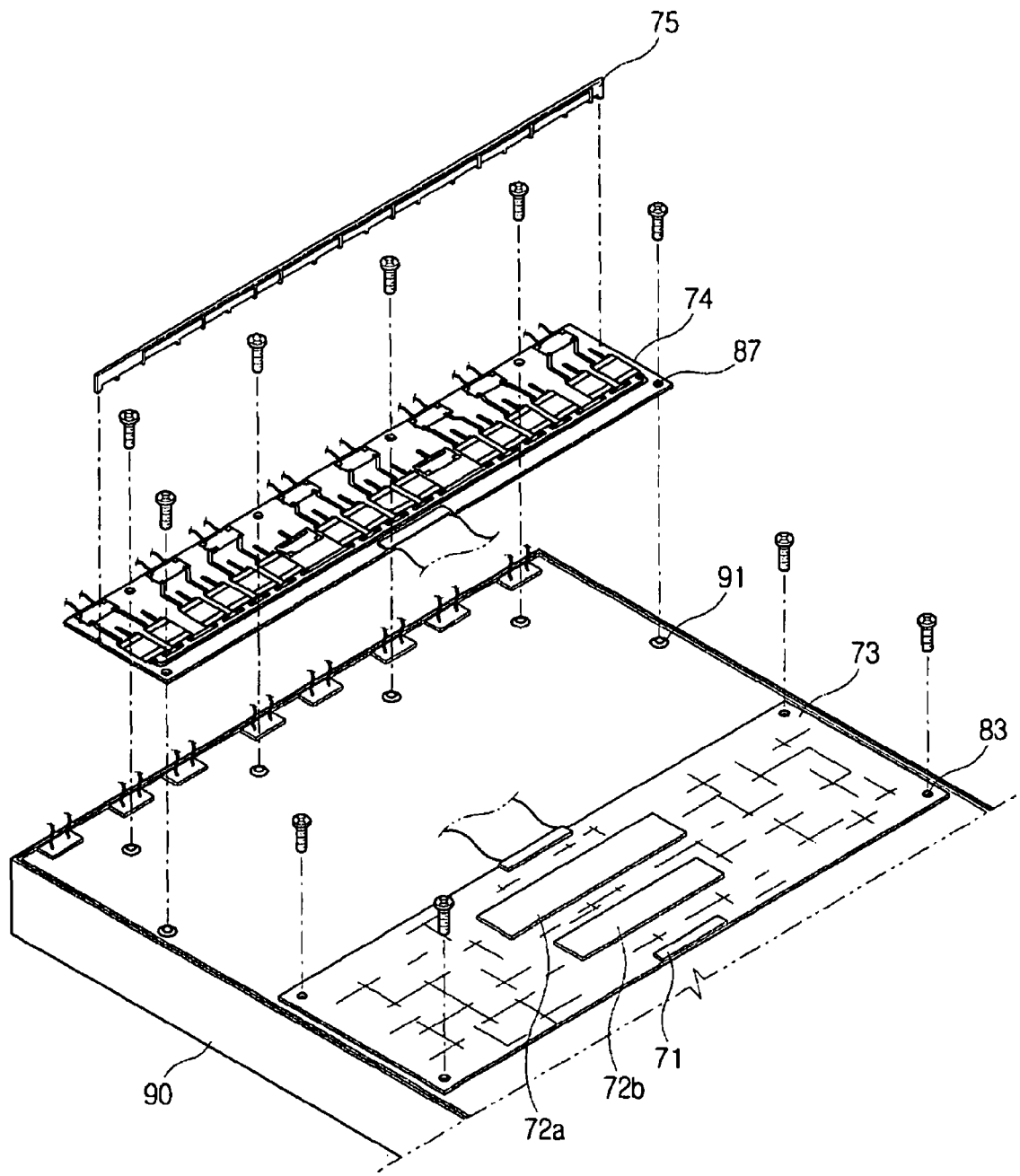
FIG. 5 is a rear side view of a liquid crystal display device having an inverter according to an embodiment of the present invention.

As shown in FIG. 5, the receptacle 90, which accommodates the backlight unit 80, is provided with a plurality of joining holes 91 to couple the inverter circuit board 73 and the power distribution circuit boards 74 and 75 to the receptacle 90. In this embodiment, the inverter 70 is coupled to the receptacle 90 in such a manner that the other side of the main circuit board 74, which is not coupled with the sub circuit board 75, faces the rear side of the receptacle 90. That is, the inverter 70 is coupled to the receptacle 75 with the sub circuit board 75 perpendicular to the main circuit board 74.

As apparent from the above description, the present invention provides an inverter and a display device having the same, which are capable of being manufactured at a low production cost.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
an LCD panel;
a plurality of light sources that emit light toward a rear side of the LCD panel; and
an inverter that supplies power to the light sources, the inverter comprising a main circuit board having a plurality of first circuit patterns and a plurality of second circuit patterns formed on a first side of the main circuit board; and
a sub circuit board having first connecting patterns formed on a first side of the sub circuit board and second connecting patterns formed on a second side of the sub circuit board,
wherein the plurality of first circuit patterns are electrically connected to each other through the first connecting patterns, and the plurality of second circuit patterns are electrically connected to each other through the second connecting patterns when the sub circuit board is coupled with the main circuit board.

2. The display device according to claim 1, wherein the area of the sub circuit board is smaller than the area of the main circuit board.

3. The display device according to claim 2, wherein the length of a long side of the sub circuit board is substantially equal to the length of a long side of the main circuit board; and the length of a short side of the sub circuit board is between 5% and 20% of the length of a short side of the main circuit board.

4. The display device according to claim 1, wherein the inverter comprises a power converter that converts power supplied from the outside into a first power and a second power to be transmitted to the light sources;

the main circuit board is provided with a first connecting terminal and a second connecting terminal that receive the first power and the second power, respectively, from the power converter; and
the first connecting terminal is connected to the first connecting patterns, and the second connecting terminal is connected to the second connecting patterns.

5. The display device according to claim 4, wherein the first circuit patterns comprise first input circuit patterns and first output circuit patterns, and the second circuit patterns comprise second input circuit patterns and second output circuit patterns; and
the first connecting patterns are connected to the first input circuit patterns to supply the received first power to the light sources through the first output circuit patterns, and the second connecting patterns are connected to the second input circuit patterns to supply the received second power to the light sources through the second output circuit patterns.

6. The display device according to claim 5, wherein the first circuit patterns and the second circuit patterns are alternately arranged.

7. The display device according to claim 5, wherein the power converter is mounted on the main circuit board.

8. The display device according to claim 5, wherein the power converter is mounted on a circuit board other than the main circuit board.

9. The display device according to claim 5, further comprising:
a receptacle that accommodates the light sources,
wherein the inverter is disposed so that a side of the main circuit board, which is not coupled with the sub circuit board, faces a rear side of the receptacle.

10. The display device according to claim 9, wherein the long side of the sub circuit board is coupled to contact one side of the main circuit board.

11. The display device according to claim 9, further comprising:
a first combining portion is provided at each short side of the main circuit board; and
second combining portions for coupling to the first combining portions at opposite end parts of the long side of the sub circuit board.

12. The display device according to claim 1, wherein the first circuit patterns, the first connecting patterns, the second circuit patterns and the second connecting patterns are provided as a form of SMD (surface mounted device).

13. The display device according to claim 4, wherein the first connecting terminal, the first connecting patterns, the second connecting terminal and the second connecting patterns are provided as a form of SMD (surface mounted device).

14. An inverter comprising:
a main circuit board having a plurality of first circuit patterns and a plurality of second circuit patterns formed on first side of the main circuit board; and
a sub circuit board having first connecting patterns formed on a first side of the sub circuit board and second connecting patterns formed on a second side of the sub circuit board,
wherein the plurality of first circuit patterns are electrically connected to each other through the first connecting patterns, and the plurality of second circuit patterns are electrically connected to each other through the second connecting patterns when the sub circuit board is coupled with the main circuit board.

15. The inverter according to claim 14, wherein the area of the sub circuit board is smaller than the area of the main circuit board.

16. The inverter according to claim 15, wherein the length of a long side of the sub circuit board is substantially equal to the length of a long side of the main circuit board; and
the length of a short side of the sub circuit board is between 5% and 20% of the length of a short side of the main circuit board.

17. The inverter according to claim 14, further comprising a power converter that converts power supplied from the outside into a first power and a second power to be transmitted to light sources;
wherein the main circuit board is provided with a first connecting terminal and a second connecting terminal that receive the first power and the second power, respectively, from the power converter; and
the first connecting terminal is connected to the first connecting patterns, and the second connecting terminal is connected to the second connecting patterns.

18. The inverter according to claim 17, wherein the first circuit patterns comprise first input circuit patterns and first output circuit patterns, and the second circuit patterns comprise second input circuit patterns and second output circuit patterns; and
the first connecting patterns are connected to the first input circuit patterns to supply the received first power to the light sources through the first output circuit patterns, and the second connecting patterns are connected to the second input circuit patterns to supply the received second power to the light sources through the second output circuit patterns.

19. The inverter according to claim 18, wherein the first circuit patterns and the second circuit patterns are alternately arranged.

20. The inverter according to claim 18, wherein the long side of the sub circuit board is coupled to contact one side of the main circuit board.

21. The inverter according to claim 20, further comprising:
a first combining portion at each short side of the main circuit board; and
second combining portions for coupling to the first combining portions at opposite end parts of the long side of the sub circuit board.

22. The inverter according to claim 14, wherein the first circuit patterns, the first connecting patterns, the second circuit patterns and the second connecting patterns are provided as a form of SMD (surface mounted device).

23. The inverter according to claim 17, wherein the first connecting terminal, the first connecting patterns, the second connecting terminal and the second connecting patterns are provided as a form of SMD (surface mounted device).

* * * * *